United States Patent
Oku (10) Patent No.: US 9,755,589 B2
(45) Date of Patent: Sep. 5, 2017

(54) AMPLIFIER WITH GAIN ADJUSTMENT RESISTOR, FEEDBACK RESISTORS AND TRANSISTORS AND OPTICAL RECEIVER INCLUDING AMPLIFIER

(71) Applicant: FUJITSU LIMITED, Kawasaki-shi, Kanagawa (JP)

(72) Inventor: Hideki Oku, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 730 days.

(21) Appl. No.: 14/047,336

(22) Filed: Oct. 7, 2013

(65) Prior Publication Data

US 2014/0158866 A1   Jun. 12, 2014

(30) Foreign Application Priority Data

Dec. 11, 2012   (JP) .................................. 2012-270594

(51) Int. Cl.
*H03F 3/08* (2006.01)
*H03G 9/00* (2006.01)
*H03G 9/02* (2006.01)

(52) U.S. Cl.
CPC ............... *H03F 3/08* (2013.01); *H03F 3/082* (2013.01); *H03G 9/005* (2013.01); *H03G 9/025* (2013.01)

(58) Field of Classification Search
CPC . H03F 3/08; H03F 3/082; H03F 3/087; H03F 3/16; H03F 3/45071; H03G 9/025; H03G 9/005; H03G 3/3084; G01J 1/44
(Continued)

(56) References Cited

U.S. PATENT DOCUMENTS 5,045,807 A * 9/1991 Ishihara ............... H03K 19/086
326/126
5,448,311 A * 9/1995 White .................... H04N 5/148
330/254
(Continued)

FOREIGN PATENT DOCUMENTS

JP    63-313903    12/1988
JP    7-288431     10/1995
(Continued)

OTHER PUBLICATIONS

S. Mohan et al., "Bandwidth Extension in CMOS with Optimized On-Chip Inductors," *IEEE Journal of Solid-State Circuits*, vol. 35, No. 3, Mar. 2000, pp. 346-355.
(Continued)

*Primary Examiner* — Que T Le
*Assistant Examiner* — Jennifer Bennett
(74) *Attorney, Agent, or Firm* — Staas & Halsey LLP (57) ABSTRACT

An amplifier circuit includes: a first transistor and a second transistor of which collectors/drains are coupled to a first power-source via a first load-impedance-element and the first power-source via a second load-impedance-element, respectively; a gain-adjustment-resistance-element that is connected to an emitter/source of the first transistor and an emitter/source of the second transistor; a first current-source and a second current-source that are connected to the emitters/the sources of the first transistor and the second transistor respectively, and a second power-source; a third transistor and a fourth transistor of which collectors/drains are connected to the first power-source and bases/gates are connected to the first load-impedance-element and the second load-impedance-element, respectively; a first feedback-resistance-element that is connected to a base/gate of the first transistor and an emitter/source of the third transistor; and a second feedback-resistance-element that is connected
(Continued)

to a base/gate of the second transistor and an emitter/source of the fourth transistor.

4 Claims, 11 Drawing Sheets

(58) Field of Classification Search
USPC ...... 250/214 A, 214 R, 214.1; 330/254, 253, 330/252, 261, 257, 277, 296
See application file for complete search history.

(56) References Cited

U.S. PATENT DOCUMENTS

| | | | | |
|---|---|---|---|---|
| 6,639,473 | B1* | 10/2003 | Kobayashi | H03F 3/08 250/214 A |
| 8,729,452 | B2* | 5/2014 | Tatsumi | H03F 3/087 250/214 A |
| 8,816,772 | B2* | 8/2014 | Sugimoto | H03F 3/08 250/214 A |
| 2007/0030055 | A1 | 2/2007 | Hasegawa | |
| 2011/0318015 | A1 | 12/2011 | Sugimoto | |

FOREIGN PATENT DOCUMENTS

| | | |
|---|---|---|
| JP | 10-117124 | 5/1998 |
| JP | 2003-209444 | 7/2003 |
| JP | 2007-49233 | 2/2007 |
| JP | 2011-124711 | 6/2011 |
| JP | 2012-10187 | 1/2012 |

OTHER PUBLICATIONS

Patent Abstracts of Japan, Publication No. 07-288431, Published Oct. 31, 1995.
Patent Abstracts of Japan, Publication No. 10-117124, Published May 6, 1998.
Patent Abstracts of Japan, Publication No. 2011-124711, Published Jun. 23, 2011.
Japanese Office Action dated Jun. 7, 2016 in corresponding Japanese Patent Application No. 2012-270594.

* cited by examiner

AMPLIFIER WITH GAIN ADJUSTMENT RESISTOR, FEEDBACK RESISTORS AND TRANSISTORS AND OPTICAL RECEIVER INCLUDING AMPLIFIER

CROSS-REFERENCE TO RELATED APPLICATION

This application is based upon and claims the benefit of priority of the prior Japanese Patent Application No. 2012-270594, filed on Dec. 11, 2012, the entire contents of which are incorporated herein by reference.

FIELD

The embodiments discussed herein are related to an amplifier and an optical receiver. Especially, the embodiments discussed herein are related to a differential transimpedance amplifier and an optical receiver using the differential transimpedance amplifier.

BACKGROUND

A high-speed optical communication system has been popularized so as to realize large-capacity information communication. On a reception side of the optical communication system, a received optical signal is photocurrent-converted by a photodiode. A high-speed current signal which is outputted from the photodiode is converted into a voltage signal by a transimpedance amplifier (TIA) and at the same time, amplified to voltage amplitude adapted to analog-digital conversion of the next stage.

Figure 1:
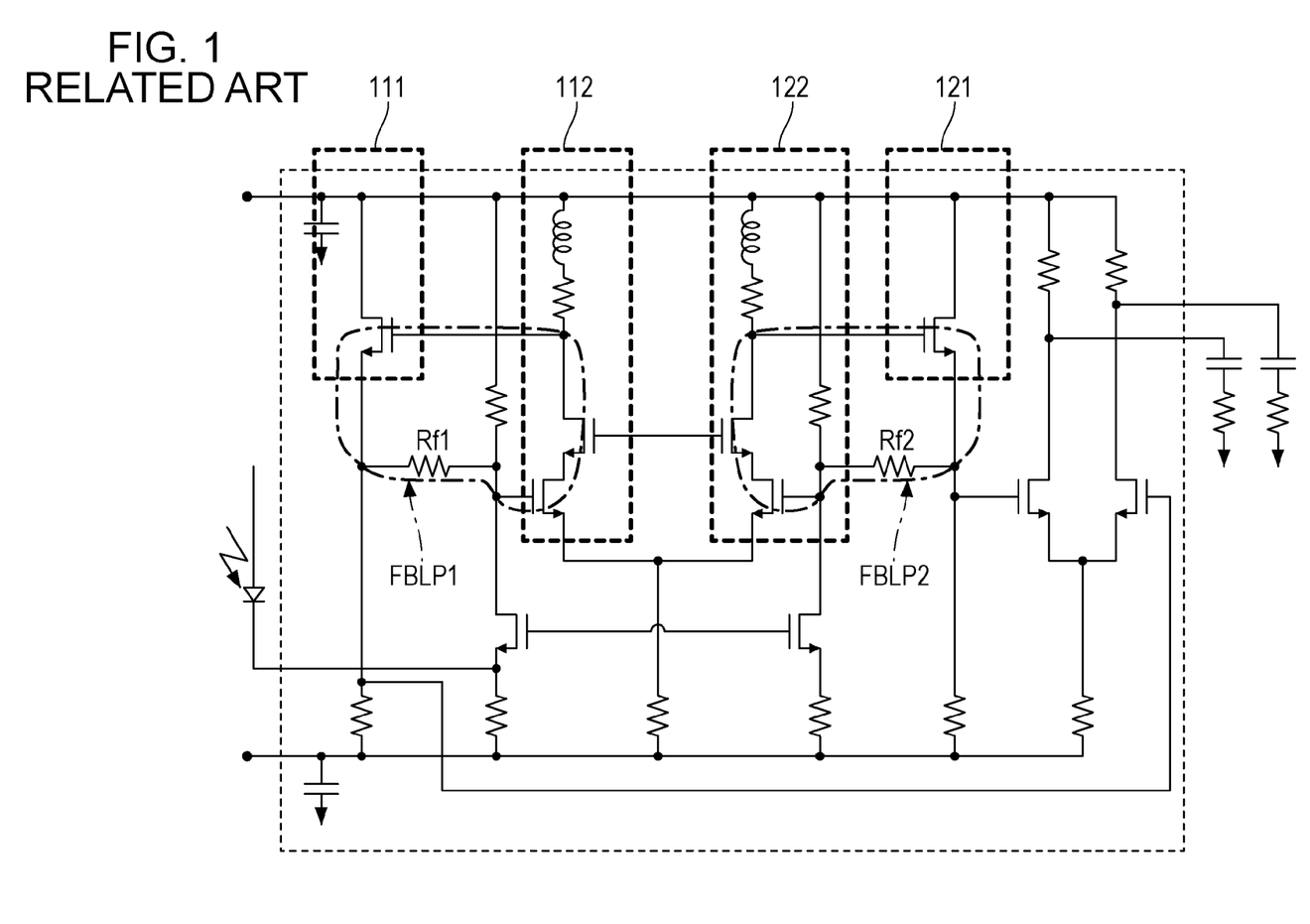
FIG. 1 is a circuit diagram of a differential amplifier of related art.

A differential system exhibiting high noise resistance is employed so as to voltage-convert/amplify a high-speed current signal. FIG. 1 is a configuration diagram of a differential amplifier circuit of related art (for example, refer to S. Mohan, et al., "Bandwidth Extension in CMOS with Optimized On-Chip Inductors", *IEEE Journal of Solid-State Circuits*, Vol. 35, No. 3, pp. 346-355, March 2000). An output of a source (or emitter) set stage 112 is inputted into a source follower (or emitter follower) stage 111 and is fed back to an input of the source (or emitter) set stage 112 via a feedback resistor Rf1. In a similar manner, an output of a source (or emitter) set stage 122 is outputted to a source follower (or emitter follower) stage 121 and is fed back to an input of the source (or emitter) set stage 122 via a feedback resistor Rf2.

In this case, stability of feedback loops FBLP1 and FBLP2 depends on poles of the differential stages 112 and 122 and the source (emitter) follower stages 111 and 121. In order to avoid oscillation of the feedback loops FBLP1 and FBLP2 and stabilize an operation, a resistance value and a current/voltage value are changed and thus an arrangement of poles and gains is adjusted. However, if these parameters are changed, operation points of respective nodes are also changed. In the configuration of related art, it is difficult to adjust an arrangement of poles and gains without changing operation points.

A gain of an amplifier is obtained on the basis of a transfer function of a feedback circuit.

$$Z_T = \frac{v_o}{i_i} \equiv \frac{w_n^2}{s^2 + 2\zeta w_n s + w_n^2} \quad (1)$$

Here, an attenuation coefficient is expressed as the following.

$$\zeta = \frac{1}{2} \frac{T_1 + T_2}{\sqrt{(G+1)T_1 T_2}} = \frac{1}{2} \frac{f_1 + f_2}{\sqrt{(G+1)f_1 f_2}} \quad (2)$$

Here, G denotes a gain of an amplifier.

$$f_1 = \frac{1}{2\pi T_1} = -\frac{p_1}{2\pi} = \frac{1}{2\pi C_1 R_1} \quad (3)$$

$$f_2 = \frac{1}{2\pi T_2} = -\frac{p_2}{2\pi} = \frac{1}{2\pi C_2 R_2}$$

$p_1$ denotes a pole of a differential stage and $p_2$ denotes a pole of an emitter follower.

When a resistance value is increased for gain adjustment, a frequency band becomes narrower. Further, when an electrostatic capacity of a capacitor is increased for phase compensation (stabilization of an operation), as well, a frequency band becomes narrower.

Figure 2:
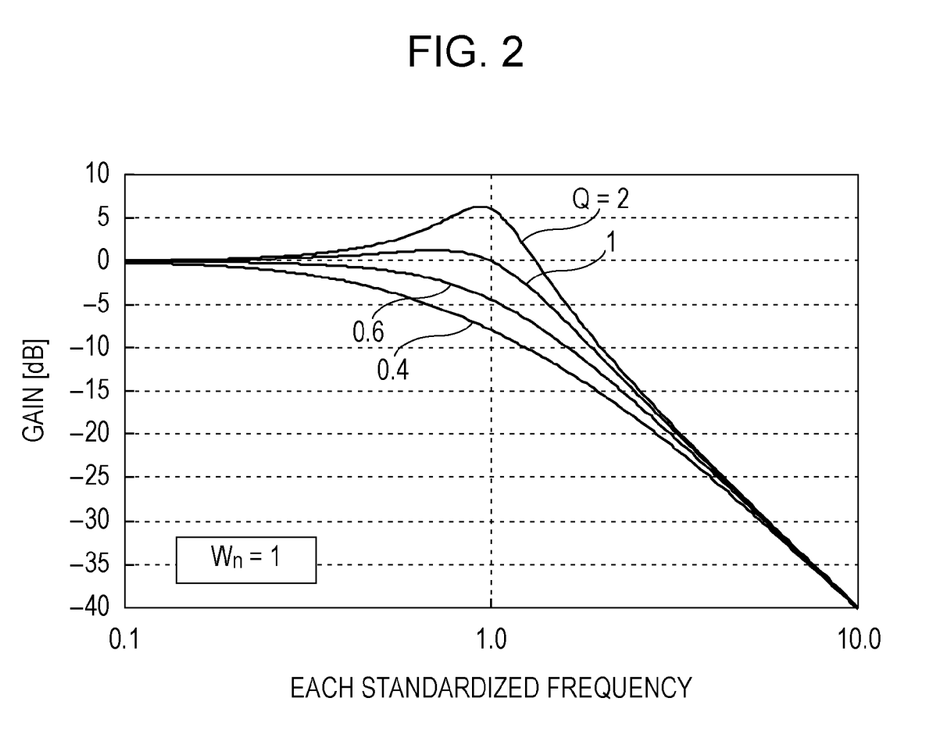
FIG. 2 is a graph illustrating a frequency property of a standardization transfer function corresponding to a Q value.

Stability of a feedback circuit may be estimated on the basis of a Q value. A Q value is expressed as $Q=1/(2\zeta)$. FIG. 2 is a graph illustrating a frequency property of a standardization transfer function corresponding to a Q value. When a Q value is increased, peaking appears. Large peaking represents instability of a feedback circuit. In order to planarize group delay characteristics without peaking, it is preferable to set a Q value to approximately 0.6.

Japanese Laid-open Patent Publication No. 10-117124 and Japanese Laid-open Patent Publication No. 2011-124711 are examples of related art.

It is desirable to provide an amplifier which is capable of adjusting a gain and realizing a stable operation (phase compensation) without changing an operation point and without narrowing a band, and an optical receiver which uses the amplifier.

SUMMARY

According to an aspect of the embodiment, an amplifier circuit includes: a first transistor and a second transistor of which collectors/drains are coupled to a first power-source via a first load-impedance-element and the first power-source via a second load-impedance-element, respectively; a gain-adjustment-resistance-element that is connected to an emitter/source of the first transistor and an emitter/source of the second transistor; a first current-source and a second current source that are connected to the emitters/the sources of the first transistor and the second transistor respectively, and a second power-source; a third transistor and a fourth transistor of which collectors/drains are connected to the first power-source and bases/gates are connected to the first load-impedance-element and the second load-impedance-element, respectively; a first feedback-resistance-element that is connected to a base/gate of the first transistor and an emitter/source of the third transistor; and a second feedback-resistance-element that is connected to a base/gate of the second transistor and an emitter/source of the fourth transistor.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present disclosure are described below with reference to the accompanying drawings. Dependency of a pole, a gain, and an operation point in a differential amplifier of related art is first described with reference to FIGS. 3A and 3B.

Figure 3A:
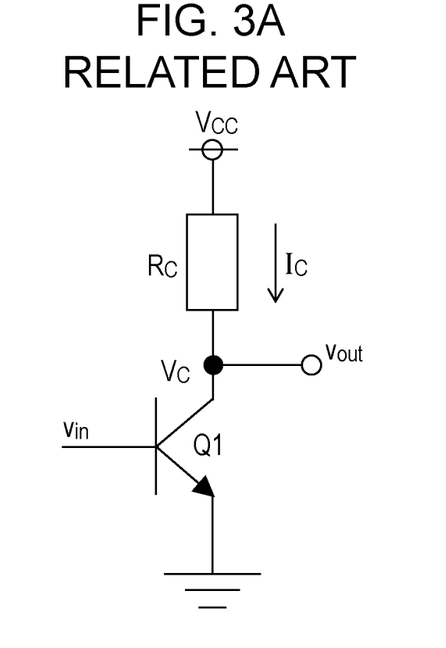
FIGS. 3A and 3B illustrate that a pole, a gain, and an operation point are not independent in the configuration of related art.

FIG. 3A illustrates a half circuit of a bipolar differential amplifier. It is sufficient only to consider about a half circuit of a bipolar differential amplifier so as to explain that a pole, a gain, and an operation point are not independent from each other. A position of a pole depends on a collector resistance $R_C$.

A circuit equation of this circuit is expressed as following.

$$\begin{cases} G = \dfrac{v_{out}}{v_{in}} = g_m R_C & (4) \\ g_m = \dfrac{I_C}{V_T} & (5) \\ I_C = \dfrac{V_{CC} - V_C}{R_C} & (6) \end{cases}$$

Here, $V_T$ denotes a thermal voltage. From formulas (4) to (6), a gain G is expressed as formula (7).

$$G = (V_{CC} - V_C)/V_T \quad (7)$$

From formula (4) and formula (7), it is understood that the gain G depends on the collector resistance $R_C$ and a potential $V_C$ (operation point) of an output node. If the collector resistance $R_C$ is adjusted to change the gain, an operation point and a position of a pole are changed. The same goes for a case in which a field-effect transistor is used.

Figure 3B:
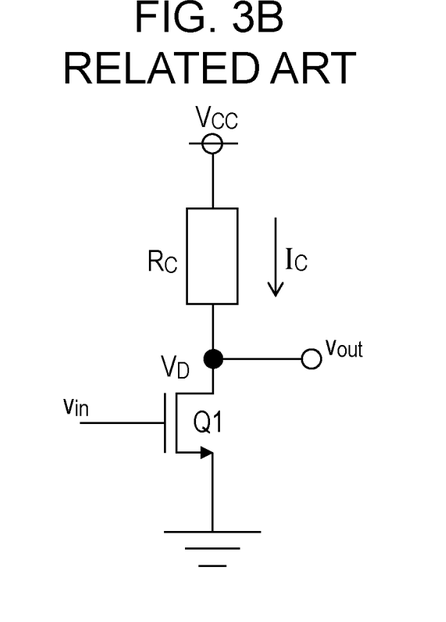

FIG. 3B illustrates a half circuit of an FET differential amplifier. It is sufficient only to consider about a half circuit of an FET differential amplifier so as to explain that a pole, a gain, and an operation point are not independent from each other. A position of a pole depends on a drain resistance $R_D$.

A circuit equation of this circuit is expressed as following.

$$\begin{cases} G = \dfrac{v_{out}}{v_{in}} = g_m R_D & (8) \\ g_m = \sqrt{2k'\dfrac{W}{L}I_D} & (9) \\ I_D = \dfrac{V_{DD} - V_D}{R_D} & (10) \end{cases}$$

Here, W denotes a gate width and L denotes a gate length. From formulas (8) to (10), a gain G is expressed as formula (11).

$$G = \sqrt{2k'\dfrac{W}{L}R_D(V_{DD} - V_D)} \quad (11)$$

From formula (8) and formula (11), it is understood that the gain G depends on the drain resistance $R_D$ and a potential $V_D$ (operation point) of an output node. If the drain resistance $R_D$ is adjusted to change the gain, an operation point and a position of a pole are changed. If the gate width W is increased to increase the gain, a band is lowered. Thus, it is difficult to change a value of W. The gate length L is approximately invariable. k' denotes a degree of movement and is an invariable depending on a unit area of a gate oxide film. Thus, it is difficult to adjust an arrangement of poles and gains without changing operation points in the configuration of related art.

To solve such problem, a resistor is disposed on an emitter (or source) side of a grounded-emitter (or grounded-source) transistor in embodiments.

Figure 4:
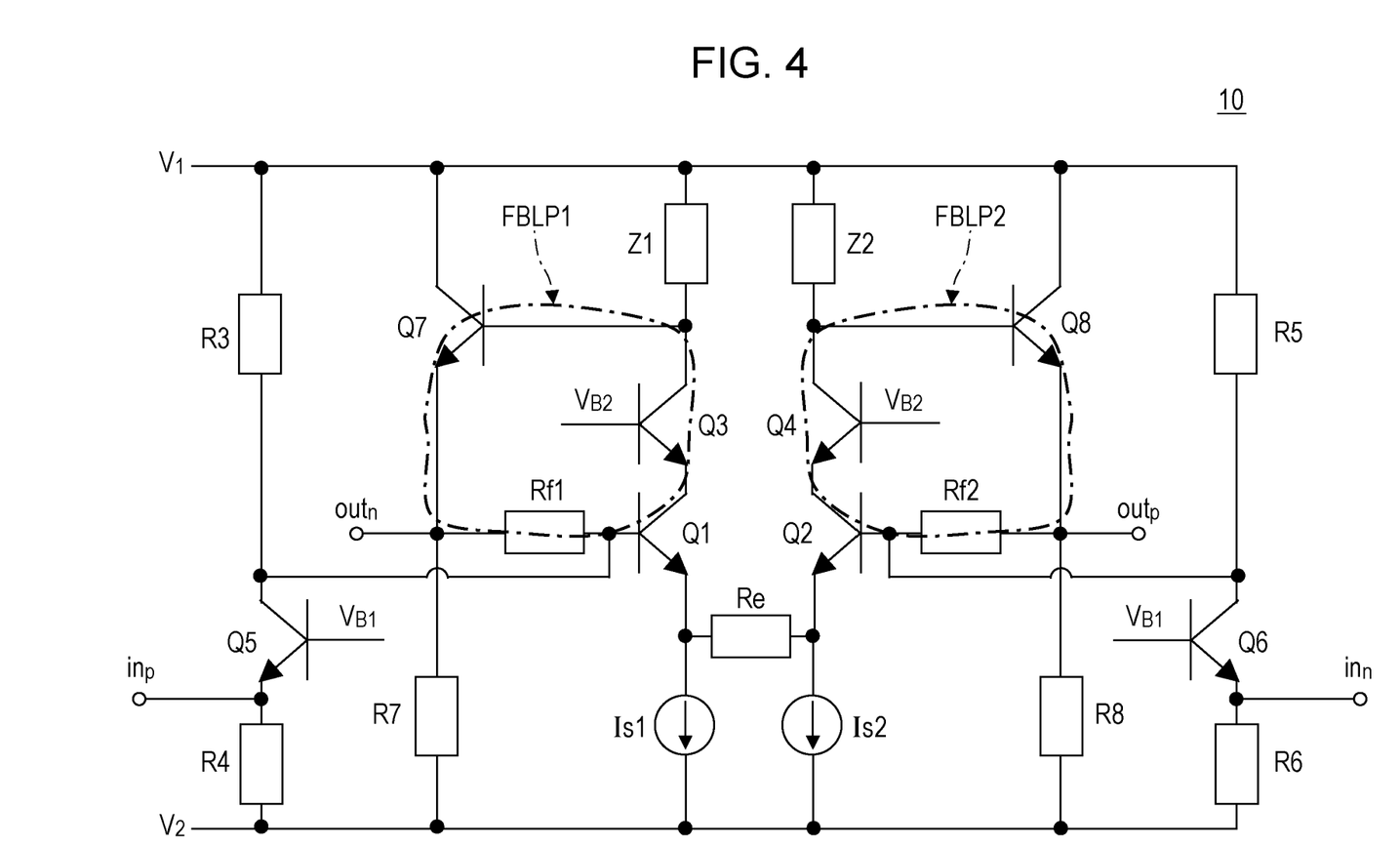
FIG. 4 is a circuit configuration diagram of a differential transimpedance amplifier according to a first embodiment.

FIG. 4 is a circuit diagram of a differential transimpedance amplifier 10 according to a first embodiment. In an example of FIG. 4, a bipolar transistor is used. The differential transimpedance amplifier 10 includes a first transistor Q1 of which a collector is coupled to a first power source $V_1$ via a first load impedance element Z1, a second transistor Q2 of which a collector is coupled to the first power source $V_1$ via a second load impedance element Z2, a resistance element Re which is connected to an emitter of the first transistor Q1 and an emitter of the second transistor Q2, a first current source Is1 which is connected to the emitter of the first transistor Q1 and a second power source $V_2$, and a second current source Is2 which is connected to the emitter of the second transistor Q2 and the second power source $V_2$.

The first transistor Q1 and the second transistor Q2 are equivalent to a grounded-emitter transistor. The resistance element Re is a resistance element for gain adjustment as described later. The load impedance elements Z1 and Z2 are resistance elements, for example.

The differential transimpedance amplifier 10 further includes a third transistor Q7 of which a collector is connected to the first power source $V_1$ and a base is connected to the first load impedance element Z1, a fourth transistor Q8 of which a collector is connected to the first power source $V_1$ and a base is connected to the second load impedance element Z2, a feedback resistance element Rf1 which is connected to a base of the first transistor Q1 and an emitter of the third transistor Q7, and a feedback resistance element Rf2 which is connected to a base of the second transistor Q2 and an emitter of the fourth transistor Q8.

The differential transimpedance amplifier 10 further includes a resistance element R7 which is connected to the emitter of the third transistor Q7 and the second power source $V_2$ and a resistance element R8 which is connected to the emitter of the fourth transistor Q8 and the second power source $V_2$. The resistance elements R7 and R8 may be replaced with constant current sources.

The differential transimpedance amplifier 10 further includes a fifth transistor Q5 of which a collector is coupled to the first power source $V_1$ via a resistance element R3 and a sixth transistor Q6 of which a collector is coupled to the first power source $V_1$ via a resistance element R5. A certain amount of bias potential is applied to bases of the fifth transistor Q5 and the sixth transistor Q6, and the fifth transistor Q5 and the sixth transistor Q6 are equivalent to grounded-base transistors.

A resistance element R4 is interposed between an emitter of the fifth transistor Q5 and the second power source $V_2$ and a resistance element R6 is interposed between an emitter of the sixth transistor Q6 and the second power source $V_2$.

The collector of the fifth transistor Q5 is connected to the base of the first transistor Q1. The collector of the sixth transistor Q6 is connected to the base of the second transistor Q2.

In this example, a cascode transistor Q3 is interposed between the collector of the first transistor Q1 and the load impedance element Z1 and a collector of the cascode transistor Q3 is connected to the base of the third transistor Q7. A certain amount of bias potential is applied to the cascode transistor Q3 and the cascode transistor Q3 functions as a grounded-base transistor. The first transistor Q1, the cascode transistor Q3, the third transistor Q7, and the feedback resistor Rf1 form a feedback loop FBLP1.

In a similar manner, a cascode transistor Q4 is interposed between the collector of the second transistor Q2 and the load impedance element Z2 and a collector of the cascode transistor Q4 is connected to the base of the fourth transistor Q8. A certain amount of bias potential is applied to the cascode transistor Q4 and the cascode transistor Q4 functions as a grounded-base transistor. The second transistor Q2, the cascode transistor Q4, the fourth transistor Q8, and the feedback resistor Rf2 form a feedback loop FBLP2.

A positive phase current signal $in_p$ of a differential signal type is inputted between the fifth transistor Q5 and the resistance element R4 in operation. A bias voltage (B1) used for applying a current the same as a certain amount of input current is applied to the base of the fifth transistor Q5. In a case in which a current level of the positive phrase current signal $in_p$ is high, current flows in the fifth transistor Q5 and current is applied to the base of the first transistor Q1.

A bias voltage (B2) used for applying a current the same as current which flows in the first transistor Q1 is applied to the cascode transistor Q3. Accordingly, when the first transistor Q1 is turned on and current flows, current also flows in the cascode transistor Q3. At this time, current which flows on a collector side of the first transistor Q1 depends on the resistance element Re. This current signal turns on the third transistor Q7 on the emitter follower stage and current is applied to the feedback resistor Rf1, generating voltage. The feedback voltage which is amplified is applied to the base of the first transistor Q1. In the feedback loop FBLP1, a negative output out is outputted from a part between the emitter of the third transistor Q7 and the feedback resistor Rf1. This negative output is one output of the differential transimpedance amplifier 10.

In a similar manner, a reversed phase current signal in of a differential signal type is inputted between the sixth transistor Q6 and the resistance element R6 and a current signal is applied to the base of the second transistor Q2. Current is applied from the cascode transistor Q4 to the base of the fourth transistor Q8 on the emitter follower stage, turning on the fourth transistor Q8. Current is applied to the feedback resistor Rf2 and thus voltage is generated. Then, the feedback voltage which is amplified is applied to the base of the second transistor Q2. Logic of a signal is reversed in the feedback loop FBLP2 and a positive output $out_p$ is outputted from a part between the emitter of the fourth transistor Q8 and the feedback resistor Rf2. This positive output is another output of the differential transimpedance amplifier 10.

Use of the cascode transistors Q3 and Q4 enables increase of a gain of an amplifier and stabilization of an operation even when a transistor having a short channel length is used. An inductor may be interposed between the cascode transistor Q3 and the load impedance element Z1. In a similar manner, an inductor may be interposed between the cascode transistor Q4 and the load impedance element Z2. The resistance elements R4 and R6 may be constant current sources.

The above-described configuration allows poles and gains to be independent from each other. This is described with reference to FIG. 5.

Figure 5:
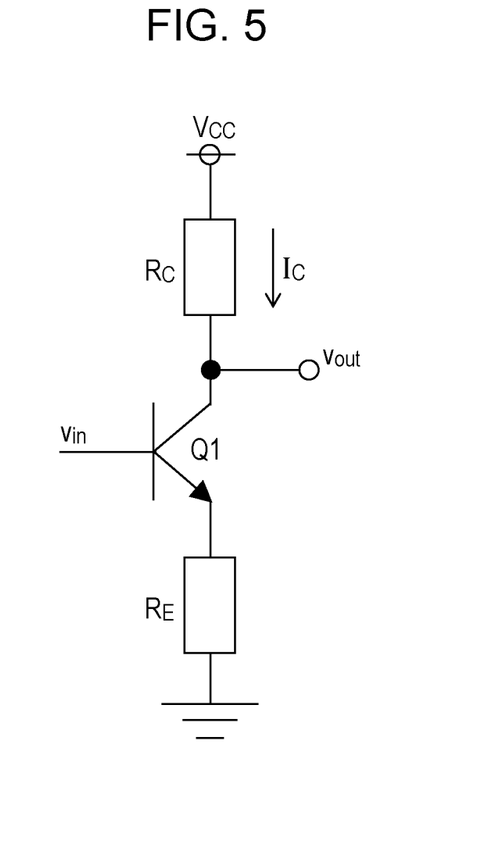
FIG. 5 illustrates that a pole, a gain, and an operation point are independent in the configuration of the first embodiment.

FIG. 5 is a circuit diagram illustrating the configuration equivalent to the differential stage of the bipolar differential amplifier according to the first embodiment (the configuration in which a resistance element Re is interposed between the emitter of the first transistor Q1 and the emitter of the second transistor Q2). It is sufficient only to consider about a half circuit of FIG. 5 so as to explain that a pole and a gain are independent from each other. The circuit of FIG. 5 is a grounded-emitter circuit. A position of a pole depends on a collector resistance $R_C$.

A circuit equation of this circuit is expressed as following.

$$\begin{cases} G = \dfrac{v_{out}}{v_{in}} & (12) \\ v_{out} = R_C i_c & (13) \\ i_c = \dfrac{v_{in}}{R_E} & (14) \end{cases}$$

Here, regarding $i_c$, a direct current $I_C$ is changed depending on an input signal $v_{in}$.

From formulas (12) to (14), a gain G is expressed by formula (15).

$$G = R_C/R_E \qquad (15)$$

That is, the gain G does not depend on the input signal $v_{in}$ and is decided depending on a collector resistance $R_C$ or a resistance element $R_E$ between the emitters of Q1 and Q2. When the collector resistance $R_C$ is changed, a position of a pole is shifted. Therefore, the resistance $R_E$ between the emitters is adjusted without changing the collector resistance $R_C$. Accordingly, it becomes possible to adjust the gain G without any change of a position of a pole and an operation point. This goes for a case of a field-effect transistor. Further, this goes for a case in which a collector resistance is an impedance element. When a field-effect transistor is used, the first transistor Q1 and the second transistor Q2 of FIG. 4 are grounded-source transistors.

Figure 6:
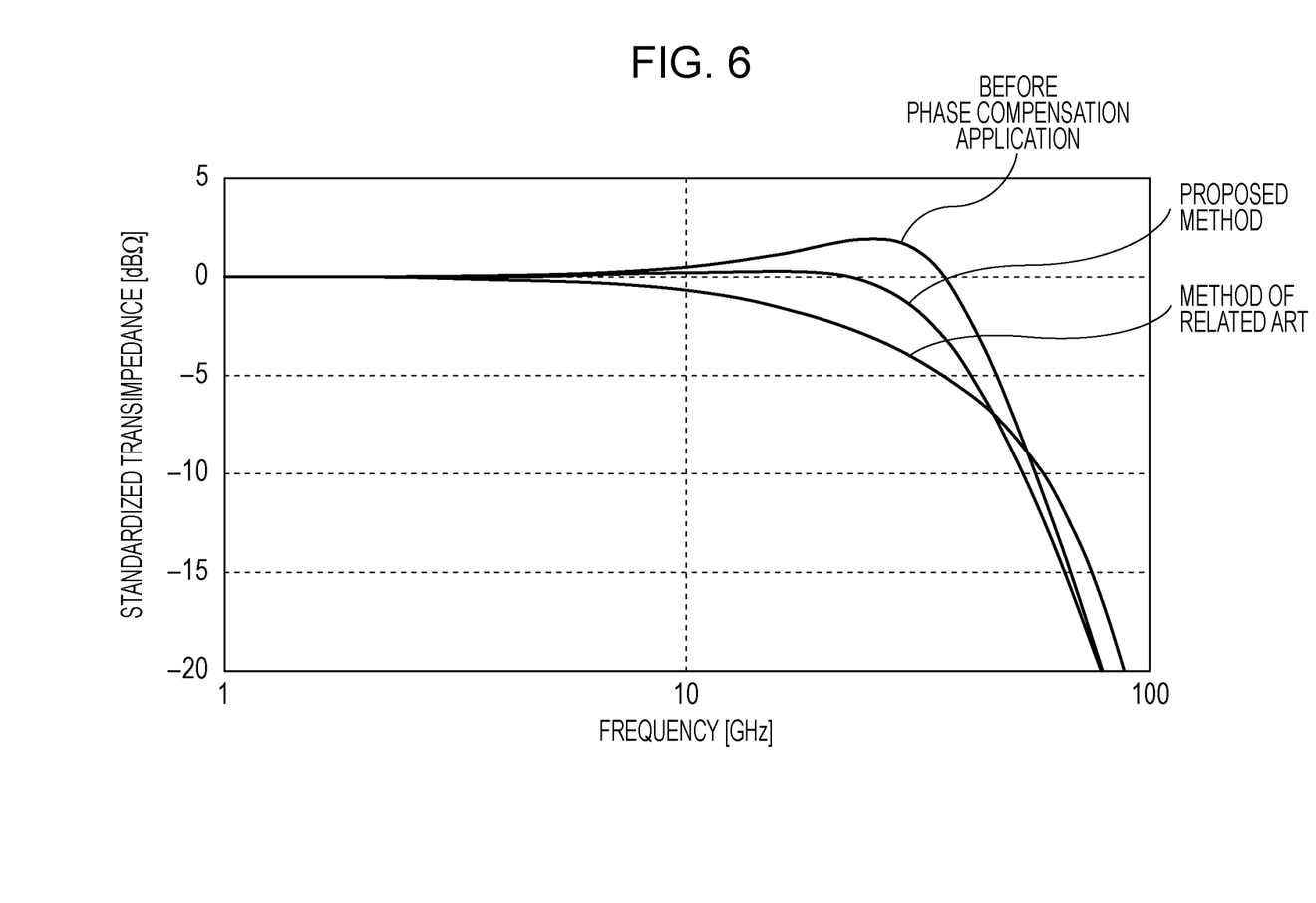
FIG. 6 illustrates a frequency property of the differential transimpedance amplifier according to the first embodiment.

FIG. 6 illustrates a frequency property of the differential transimpedance amplifier according to the first embodiment. A frequency property of a case in which the configuration of related art of FIG. 1 is employed and a frequency property of a circuit to which phase compensation (stabilization) is not applied are also illustrated as comparison examples.

In the circuit of related art, a band becomes narrow. In the circuit in which phase compensation (stabilization) is not performed, peaking occurs. On the other hand, the circuit configuration of the first embodiment exhibits an advantage in which it is possible to reduce peaking while securing a band.

Figure 7:
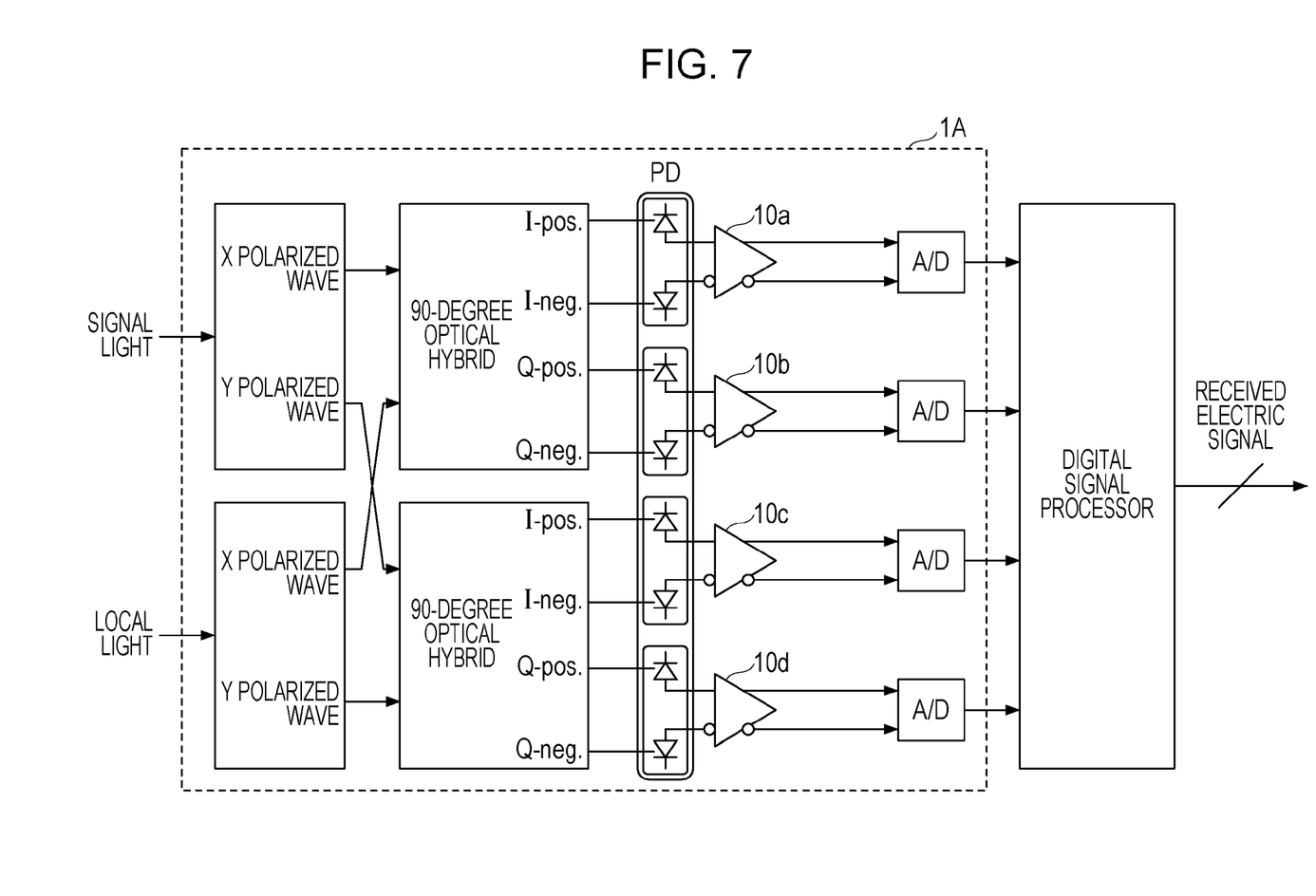
FIG. 7 illustrates a configuration example of an optical receiver to which the differential transimpedance amplifier of the first embodiment is applied.

When the gain G is adjusted on the basis of an optimal Q value, it is sufficient only to adjust the resistor Re which is connected to the emitter sides of the grounded-emitter transistors (Q1 and Q2) of differential transimpedance amplifiers 10a and 10b (FIG. 7). Since operation points and positions of poles are not changed, the gain is easily adjusted.

Figure 8:
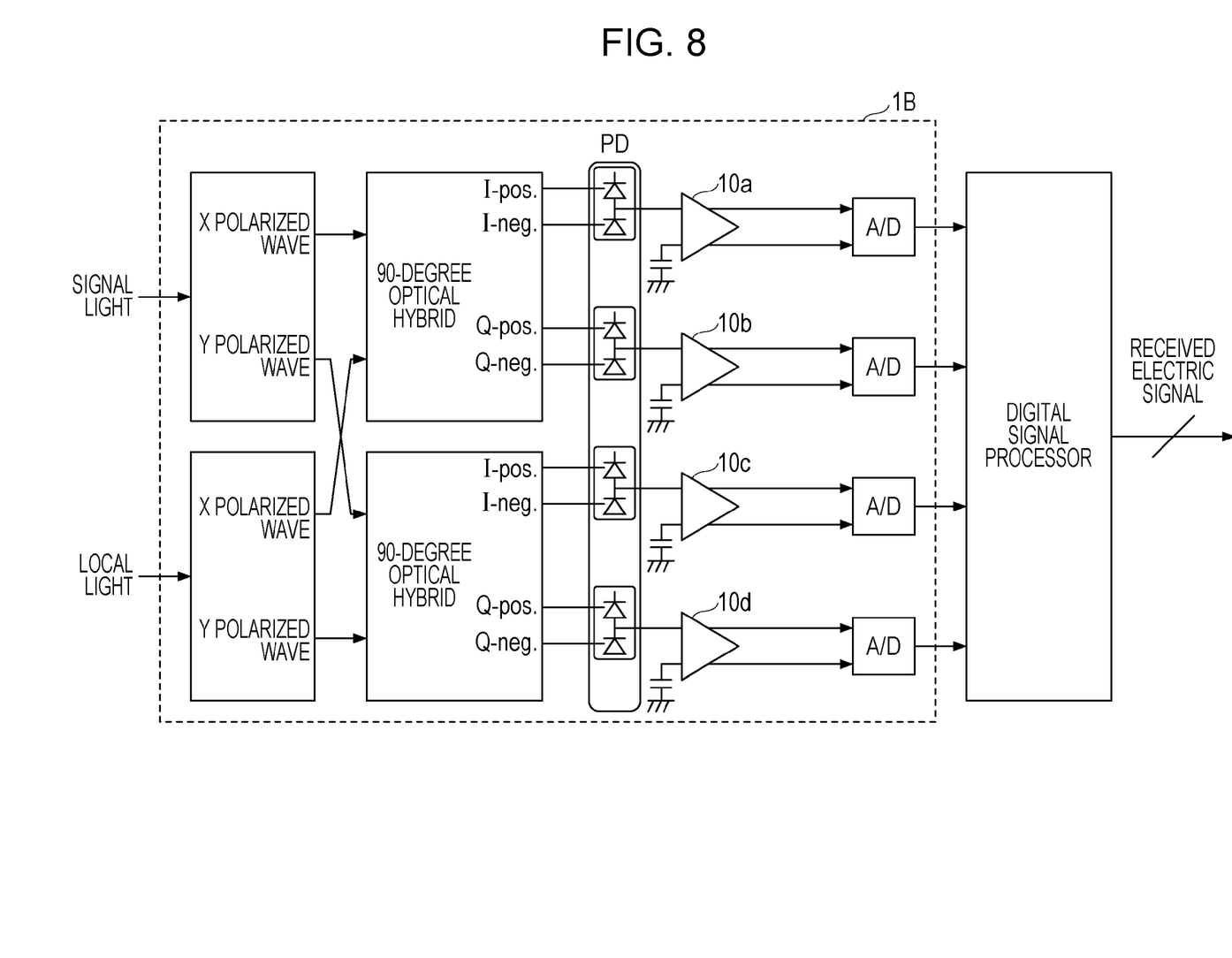
FIG. 8 illustrates another configuration example of an optical receiver to which the differential transimpedance amplifier of the first embodiment is applied.

The amplifier circuit 10 of FIG. 4 is applicable to optical receivers 1A and 1B as depicted in FIGS. 7 and 8. The optical receivers 1A and 1B are optical receivers of the DP-QPSK system, for example. However, the amplifier circuit 10 is not limited to these optical receivers, but may be applied to arbitrary optical receivers which convert current which is detected from an optical signal into a voltage.

Figure 9:
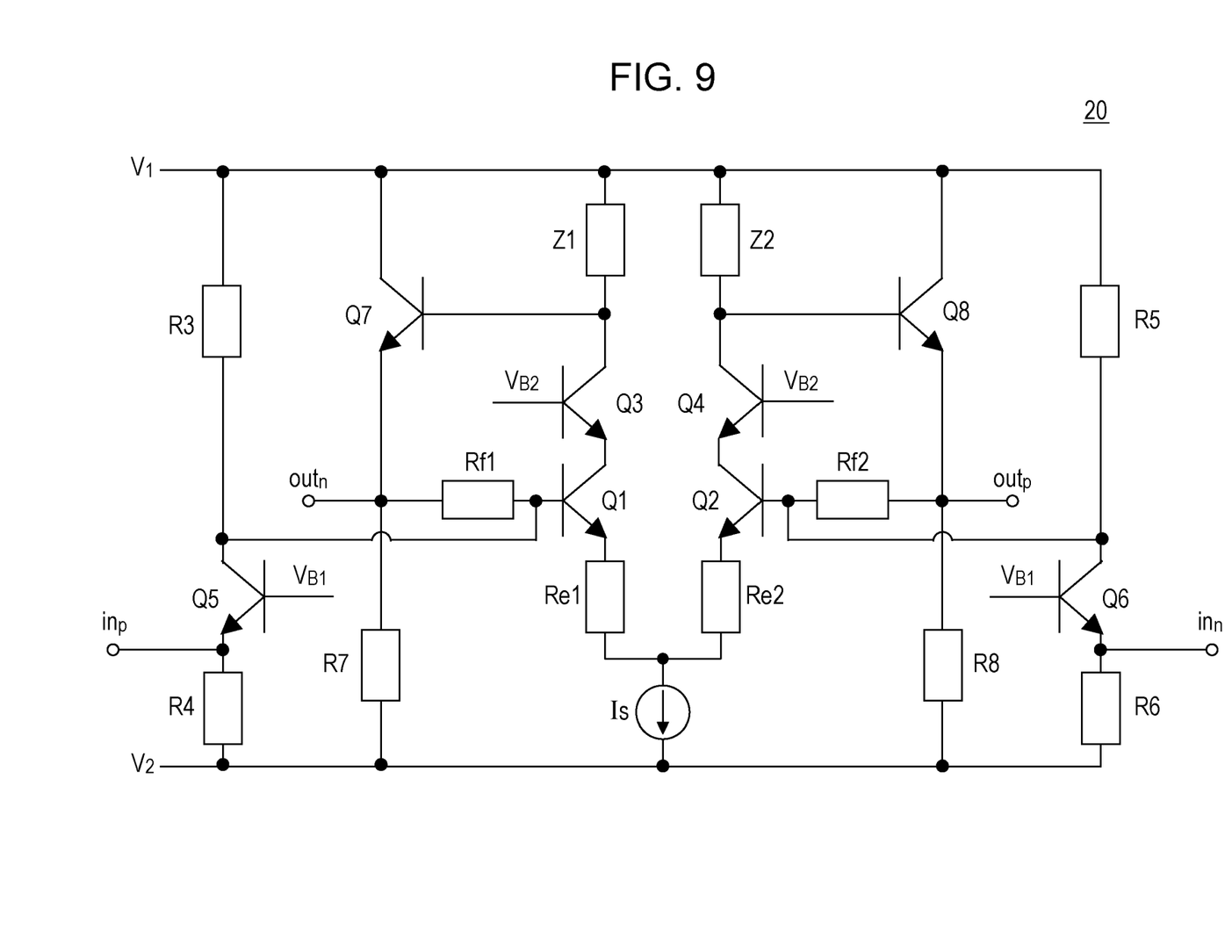
FIG. 9 is a circuit configuration diagram of a differential transimpedance amplifier according to a second embodiment.

FIG. 9 illustrates a configuration example of a differential transimpedance amplifier 20 according to a second embodiment. In a circuit of the second embodiment, one current source Is used between a grounded-emitter transistor (the first transistor Q1 and the second transistor Q2) on the differential stage and the second power source $V_2$.

The emitter of the first transistor Q1 is connected to a first gain adjustment resistance element Re1. The emitter of the second transistor Q2 is connected to a second gain adjustment resistance element Ret. The first gain adjustment resistance element Re1 and the second gain adjustment resistance element Re2 are coupled to the second power source $V_2$ via the current source Is. Other configurations are the same as those of the first embodiment.

In the second embodiment, a voltage corresponding to a sum of a voltage corresponding to the current source Is and a voltage corresponding to the gain adjustment resistor Re is used on each differential stage, so that a voltage to be used is slightly larger than that of the first embodiment. However, the circuit on the differential stage is equivalent to the half circuit of FIG. 5, and it is possible to adjust the gain G only by adjusting the resistance elements Re1 and Re2.

Figure 10:
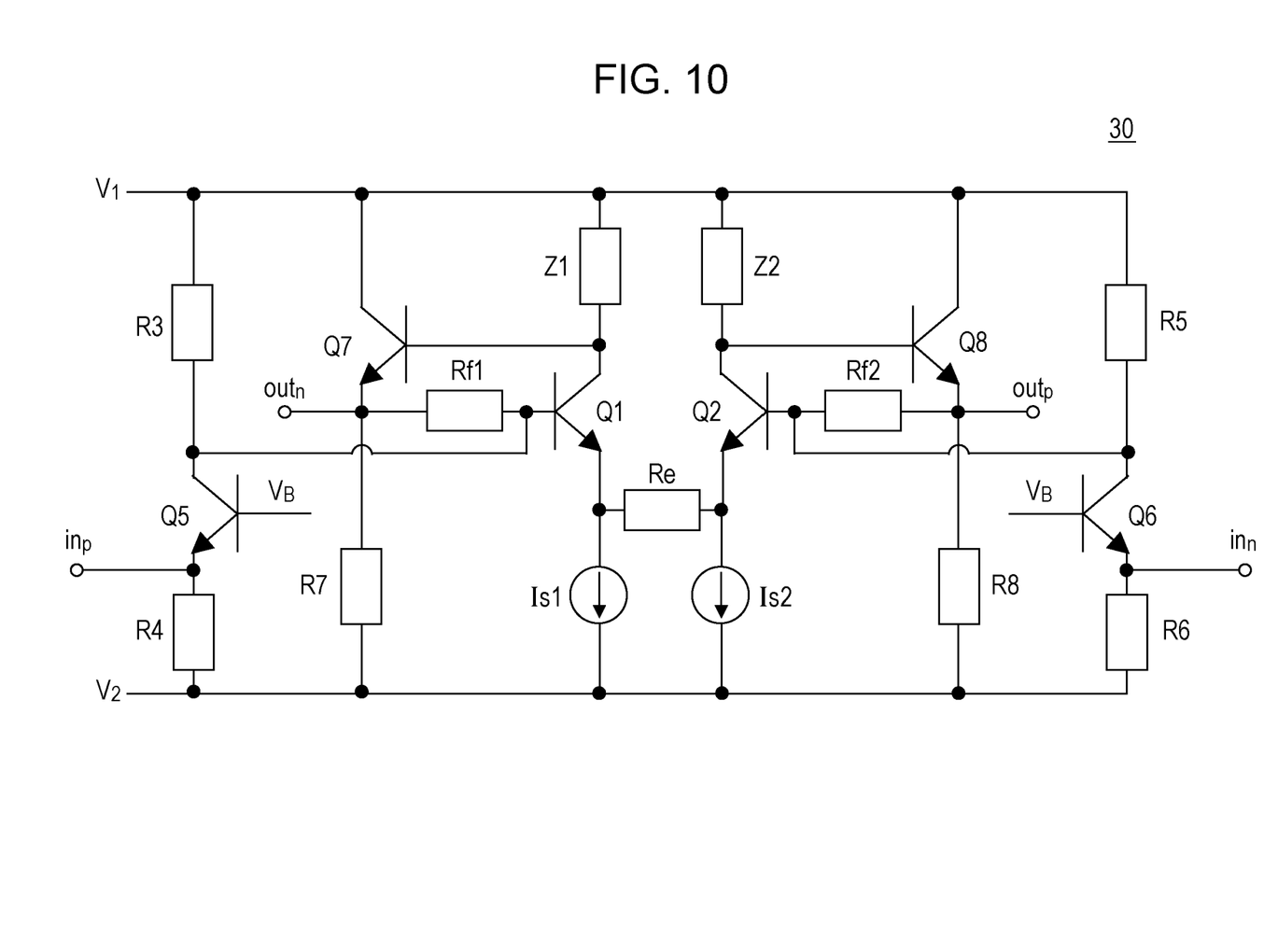
FIG. 10 is a circuit configuration diagram of a differential transimpedance amplifier according to a third embodiment.

FIG. 10 illustrates a configuration example of a differential transimpedance amplifier 30 according to a third embodiment. In the third embodiment, the cascode transistors Q3 and Q4 are omitted from the configuration of the first embodiment. Even in a case in which the cascode transistors Q3 and Q4 are omitted, it is possible to adjust a gain, without changing operation points and poles, by properly adjusting the gain adjustment resistance element Re.

Figure 11:
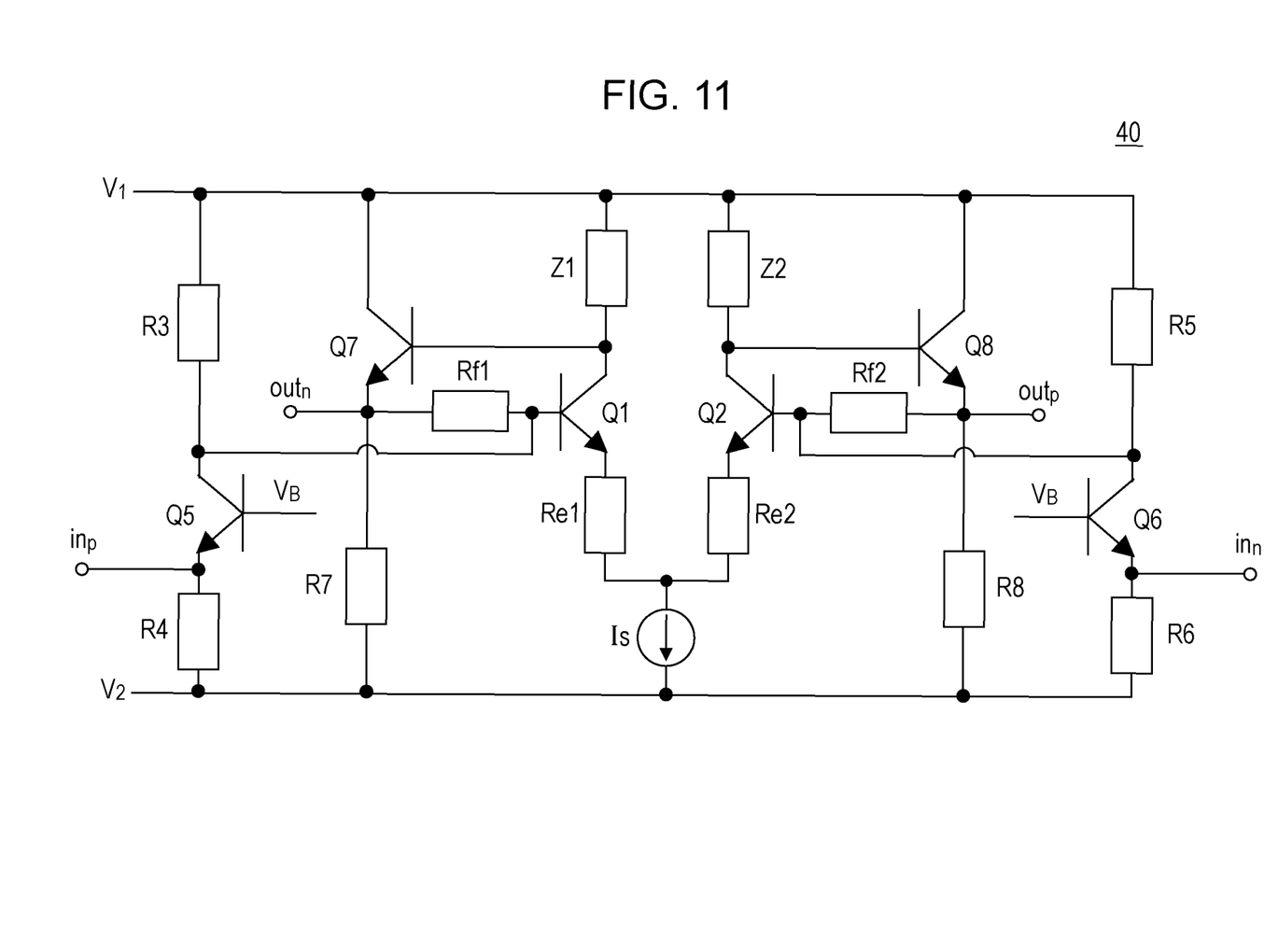
FIG. 11 is a circuit configuration diagram of a differential transimpedance amplifier according to a fourth embodiment.

FIG. 11 illustrates a configuration example of a differential transimpedance amplifier 40 according to a fourth embodiment. In the fourth embodiment, the cascode transistors Q3 and Q4 are omitted from the configuration of the second embodiment. This configuration is also equivalent to the half circuit of FIG. 5, so that it is possible to adjust a gain G, without changing operation points and poles, only by adjusting the gain adjustment resistance elements Re1 and Re2.

In any embodiment, a field-effect transistor may be used instead of a bipolar transistor. The differential transimpedance amplifier of any embodiment may be favorably applied to an optical receiver.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier circuit comprising:
   a first transistor of which a collector or a drain is coupled to a first power source via a first load impedance element;
   a second transistor of which a collector or a drain is coupled to the first power source via a second load impedance element;
   a gain adjustment resistor that is connected to an emitter or a source of the first transistor and an emitter or a source of the second transistor;
   a first current source that is connected to the emitter or the source of the first transistor and a second power source;
   a second current source that is connected to the emitter or the source of the second transistor and the second power source;
   a third transistor of which a collector or a drain is connected to the first power source and a base or a gate is connected to the first load impedance element;
   a fourth transistor of which a collector or a drain is connected to the first power source and a base or a gate is connected to the second load impedance element;
   a first feedback resistor that is directly connected to a base or a gate of the first transistor and directly connected to an emitter or a source of the third transistor;
   a second feedback resistor that is directly connected to a base or a gate of the second transistor and directly connected to an emitter or a source of the fourth transistor;
   a fifth transistor that is directly connected to the collector or the drain of the first transistor in series; and
   a sixth transistor that is directly connected to the collector or the drain of the second transistor in series, wherein
   a collector or a drain of the fifth transistor is connected to the base or the gate of the third transistor and a collector or a drain of the sixth transistor is connected to the base or the gate of the fourth transistor.

2. The amplifier circuit according to claim 1, wherein the first load impedance element and the second load impedance element are resistors.

3. The amplifier circuit according to claim 1, further comprising:
   a seventh transistor of which a collector or a drain is coupled to the first power source via a first resistor; and
   an eighth transistor of which a collector or a drain is coupled to the first power source via a second resistor; wherein
   the collector or the drain of the seventh transistor is connected with the base or the gate of the first transistor and the collector or the drain of the eighth transistor is connected with the base or the gate of the second transistor.

4. An optical receiver comprising:
   an optical detector configured to convert received signal light into current; and an amplifier circuit, including:
  a first transistor of which a collector or a drain is coupled to a first power source via a first load resistor;
  a second transistor of which a collector or a drain is coupled to the first power source via a second load resistor;
  a gain adjustment resistor that is connected to an emitter or a source of the first transistor and an emitter or a source of the second transistor;
  a first current source that is connected to the emitter or the source of the first transistor and a second power source;
  a second current source that is connected to the emitter or the source of the second transistor and the second power source;
  a third transistor of which a collector or a drain is connected to the first power source and a base or a gate is connected to the first load resistor;
  a fourth transistor of which a collector or a drain is connected to the first power source and a base or a gate is connected to the second load resistor;
  a first feedback resistor that is directly connected to a base or a gate of the first transistor and directly connected to an emitter or a source of the third transistor;
  a second feedback resistor that is directly connected to a base or a gate of the second transistor and directly connected to an emitter or a source of the fourth transistor;
  a fifth transistor that is directly connected to the collector or the drain of the first transistor in series; and
  a sixth transistor that is directly connected to the collector or the drain of the second transistor in series,
  wherein the amplifier circuit converts current, the current being generated in the optical detector, into voltage and amplifies the current, and
  wherein a collector or a drain of the fifth transistor is connected to the base or the gate of the third transistor and a collector or a drain of the sixth transistor is connected to the base or the gate of the fourth transistor.

* * * * *